United States Patent [19]

Nelson et al.

[11] Patent Number: 5,232,569
[45] Date of Patent: Aug. 3, 1993

[54] CIRCULARLY SYMMETRIC, LARGE-AREA, HIGH-DEPOSITION-RATE SPUTTERING APPARATUS FOR THE COATING OF DISK SUBSTRATES

[75] Inventors: Carl W. Nelson, Hayward; Richard D. Weir, Agoura Hills, both of Calif.

[73] Assignee: Tulip Memory Systems, Inc., Fremont, Calif.

[21] Appl. No.: 848,251

[22] Filed: Mar. 9, 1992

[51] Int. Cl.$^5$ ............................................. C23C 14/34
[52] U.S. Cl. ............................ 204/192.15; 204/192.12; 204/192.16; 204/192.2; 204/298.06; 204/298.16; 204/298.23
[58] Field of Search .................. 204/192.12, 192.15, 204/192.16, 192.2, 298.16, 298.06, 298.19, 298.23, 298.25

[56] References Cited

U.S. PATENT DOCUMENTS

| | | | |
|---|---|---|---|
| 3,369,991 | 2/1968 | Davidse | 204/298 |
| 4,534,842 | 8/1985 | Arnal | 204/192 E |
| 4,721,553 | 1/1988 | Saito et al. | 204/298.16 X |
| 4,745,337 | 5/1988 | Pichot et al. | 315/111.41 |
| 4,957,604 | 9/1990 | Steininger | 204/192.2 X |
| 4,990,229 | 2/1991 | Campbell et al. | 204/298.06 |
| 5,091,049 | 2/1992 | Campbell et al. | 156/643 |

FOREIGN PATENT DOCUMENTS 0127862 6/1986 Japan .......................... 204/298.16

OTHER PUBLICATIONS

Article: Burke, et al.: "DECR in Silicon Processing," J. Vac. Sci. Technol. A. vol. 8, No. 3, May/Jun. 1990, pp. 2932–2938.

Primary Examiner—Nam X. Nguyen
Attorney, Agent, or Firm—Limbach & Limbach

[57] ABSTRACT

Disclosed is a sputtering apparatus and method for deposition of a film on a substrate with means for exciting a plasma by ultrahigh radio frequency or microwave at the electron cyclotron resonance to create a region of plasma which is devoid of magnetic field and at least one high-radio frequency planar disk diode positioned within the region devoid of magnetic field, a target attached to said rf planar diode, and a high-radio frequency substrate biasing electrode parallel to the planar diode.

27 Claims, 4 Drawing Sheets

CIRCULARLY SYMMETRIC, LARGE-AREA, HIGH-DEPOSITION-RATE SPUTTERING APPARATUS FOR THE COATING OF DISK SUBSTRATES

BRIEF DESCRIPTION OF THE INVENTION

The present invention relates generally to magnetic-recording and magneto-optical disk fabrication, and more specifically to the deposition of the various thin-film layers onto metal substrates by means of a circularly symmetric, large-area, high-deposition-rate sputtering source configuration.

BACKGROUND OF THE INVENTION

In the fabrication of data-storage media (both magnetic-recording and magneto-optical), the most common technique for depositing the various thin-film layers is magnetron diode sputtering. The sputtering system approaches that are used in the production of magnetic-recording media consist mainly of two configurations: 1) for each thin-film layer, dual-side coating of a single disk substrate in the static-deposition mode from a pair of circularly symmetric planar (or planar ring) magnetron diode sputtering sources, and 2) for each thin-film layer, dual-side coating of a platen of several disk substrates in the dynamic-deposition (passby) mode from a pair of rectangular planar magnetron diode sputtering sources.

Both approaches are best accomplished in systems where process-isolated chambers are provided so that the substrate outgassing, sputter-etch cleaning, and heating steps, from which reactive gases (water vapor, air, organic solvents) are evolved, do not interfere with the inert-gas sputter-deposition steps. Similarly, a sputter-deposition step, involving a target material where a reactive gas (or gases) is intentionally employed or involving a target material whose composition comprises a reactive-gas constituent or whose microstructure contains a reactive gas (or gases) in its micropores, must be carried out in an isolated process chamber. This extremely important aspect pertaining to vacuum cleanliness is much more easily implemented in a system design based upon static deposition than on one based upon passby deposition. The presence of reactive gases during sputtering has a deleterious effect on the morphology and the magnetic properties of the deposited films, greatly affecting their uniformity and reproducibility.

In the aforementioned static- and dynamic-deposition sputtering system approaches, due to the requirement of product throughput, the sequential steps are essentially simultaneously operated so that there is a disk at or a platen of disks passing by each of the several stations, respectively. The static-deposition approach in which a single disk per pair of circular symmetric sputtering sources is employed has a significant advantage in that excellent circumferential uniformity of film morphology and thus of magnetic characteristics is obtained, even at the lowest (which is highly desirable) sputtering gas pressure. However, there are disadvantages to this particular static-deposition approach in that the product throughput and coating cost are independent of disk diameter and the economies of scale are not available for costly components, such as source power supplies and chamber vacuum valves, pumps, gauges, mass flow controllers, the transport mechanism, the process sequencer, etc.—the major cost-determining items of the sputtering system.

This situation is reversed in the passby approach where a platen of several disks per pair of rectangular line-deposition sputtering sources is employed. However, the serious disadvantage entailed in the passby approach is the lack of circumferential uniformity of film morphology and hence of magnetic characteristics along the circular tracks of the disk. These undesirable features are caused by the source-determined differing and changing angles of incidence of the arriving sputtered atoms at the substrate as the platen passes by the line-deposition sources. This problem can be overcome by operation at higher sputtering gas pressure or with increased source-to-substrate separation or with some combination of both. Since the sputtered atoms suffer because many more gas collisions occur in transit, as their directionality is lost and their arrival angles become randomized, the advantages of low-pressure deposition are thereby sacrificed. The once energetic sputtered atoms, losing their energy by gas collisional scattering, become thermalized. Consequently, the adhesive strength of the film to the substrate decreases, with an abrupt interfacial boundary forming instead of a graded diffused one. Additionally, the cohesive strength of the film decreases, with the thermalized-atom-deposited porous columnar Zone 1 or the still more porous Zone 1' (on the Movchan-Demchishin-Thornton zone-structure diagram) structure resulting instead of the energetic-atom-deposited dense fibrous Zone T structure.

Another sputtering system approach, though not in general use for the production of data-storage media, entails the use of high-radio frequency-powered (13.56 MHz) large-area circularly symmetric planar disk diode sputtering sources. In this approach for each thin-film layer, dual-sources. side coating of a platen of several disk substrates in the static-deposition mode from a pair of these large-area sputtering sources would be employed, thereby combining the advantages of the two aforementioned approaches with none of their respective disadvantages. There is, however, one inherent disadvantage of the 13.56 MHz rf planar disk diode sputtering source; namely, for a given system configuration, moderate deposition rates are obtained instead of the high deposition rates obtained with magnetron diode sputtering sources. Furthermore, in rf planar disk diode sources the sputtering-target utilization is greater than 90%, whereas in planar magnetron diode sources it is typically less than 30%, particularly for target materials of ferromagnetic and ferrimagnetic substances.

In addition, a properly designed sputtering system configuration with two like oppositely facing rf planar disk diode sources requires that the chamber diameter or box size be at least three times the diameter of the source so that there be sufficient grounded area in contact with the gas discharge in order to keep the plasma potential low with respect to ground. Since such systems are geometry dependent with the rf power and hence voltage dividing according to the respective areas of the target electrode (or electrodes) and of the grounded walls in contact with the gas discharge (the Koenig-Maissel relationship), the plasma potential with respect to ground then (1) increases with increasing geometrical confinement for a given power input, (2) increases with increasing power input for a given pressure, and (3) decreases with increasing pressure for a given power input. Thus, inadvertently, grounded surfaces and insulating surfaces, too, become subject to energetic ion bombardment (i.e., sputtering) in systems with geometrically confined rf discharges, resulting in the contamination of the sputter-deposited films with the materials of the chamber. The significant references further describing this phenomenon are as follows: H.R. Koenig and L. I. Maissel, IBM J. Res. Develop. 14, 168 (1970); J. W. Coburn and E. Kay, J. Appl. Phys. 43, 4965 (1972); and J. L. Vossen, J. Electrochem. Soc. 126, 319 (1979).

The moderate-deposition-rate limitation and the large-grounded-area requirement of the rf planar disk diode sputtering source can be overcome by means of a supported gas discharge. The means by which this feat is accomplished is the subject of this invention.

A method and device for obtaining a large-volume, high-density, and homogeneous plasma have been described in the U.S. Patent, "Method and Device for Exciting a Plasma Using Microwaves at the Electronic Cyclotronic Resonance," issued to M. Pichot, J. Pelletier, and Y. Arnal, U.S. Pat. No. 4,745,337, issued May 17, 1988 (filed Jun. 6, 1986), assigned to Centre National d'Etudes des Telecommunications; Centre National De La Recherche Scientifique, both of Paris, France, and is herein incorporated by reference.

This method and device utilize a coaxial structure for introducing microwave power to a ring antenna array inside a multipolar magnetic confinement structure at the electron-cyclotron-resonance condition in order to sustain a gas discharge with a high plasma density and a low plasma potential. Within the central magnetic-field-free region, the plasma is homogeneous, isotropic, and uniform in electron/ion density. By such means a large useful area is provided for plasma processing to which may be added another structure.

In a magnetic disk file, the most common recording medium is a very flat and smooth aluminum-alloy disk having both its surfaces coated with a ferrimagnetic or ferro-magnetic oxide powder dispersed in a resin binder or a ferromagnetic cobalt alloy as a plated or sputter-deposited thin film. Aluminum is a soft metal and therefore, in the attempt to avoid read/write failure caused by the read/write head impacting the disk too forcefully, the aluminum-alloy disk is typically first coated with a hard material before the ferromagnetic cobalt alloy is applied. However, typically the surfaces coated with hard materials need to be either diamond tool turned on a lathe or ground by a surface grinder. Other labor-intensive methods are used to attempt to provide a surface free of nodules, pits and bumps; however, typically, these labor-intensive methods fall short of their intended purpose.

In the magneto-optical disk file, typically an active recording layer is applied to either a substrate or a substrate coating layer. The active recording layer is a ferromagnetic material with a substantial Kerr magneto-optical effect. When an opposing magnetic field is applied to this material locally laser heated to near but below the compensation or Curie temperature, the alignment of the magnetic moments may be reversed.

In the case where the ferromagnetic material is layered on or near a metal substrate disk, as is the case for magneto-optical recording disks, eddy currents are generated within the metal substrate by the applied magnetic field and affect the alignment of the magnetic moments of the ferromagnetic material. Instead of providing a preferred orderly alignment of magnetic moments, disorder is introduced into the system of the ferromagnetic material by the eddy currents. The disorder causes an undesirable reduced signal-to-noise ratio of the output signals.

SUMMARY AND OBJECTS OF THE INVENTION

It is a general object of the present invention to provide an improved and very versatile sputtering system configuration for the manufacture of magnetic-recording and magneto-optical data-storage disks.

It is another object of the present invention to reduce the costs involved in the manufacture of magnetic-recording and magneto-optical disks.

It is a further object of the present invention to provide a means of achieving a high deposition rate.

It is yet another object of the present invention to provide maximum (greater than 90%) utilization of the sputtering-target material.

It is a still further object of the present invention to provide high-radio frequency (13.56 MHz) substrate bias sputtering, with higher bombarding ion current density than is normal, for enhanced control of the film morphology and hence control of the magnetic properties.

These and other objects are provided by a sputtering apparatus for deposition of a thin film on a substrate with means for exciting a plasma by ultrahigh radio frequency or microwave at the electron cyclotron resonance and configured so as to create a region of plasma which is devoid of magnetic field and at least one high-radio frequency-powered planar disk diode positioned within the region devoid of magnetic field, a target attached to said rf planar diode, and a high-radio frequency-powered substrate biasing electrode parallel to the planar diode.

BRIEF DESCRIPTION OF THE DRAWINGS

Other objects, and many of the intended advantages of the present invention, will be readily appreciated as the same becomes better understood by reference to the following detailed description when considered in connection with the accompanying drawings wherein.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the claims.

Figure 1:
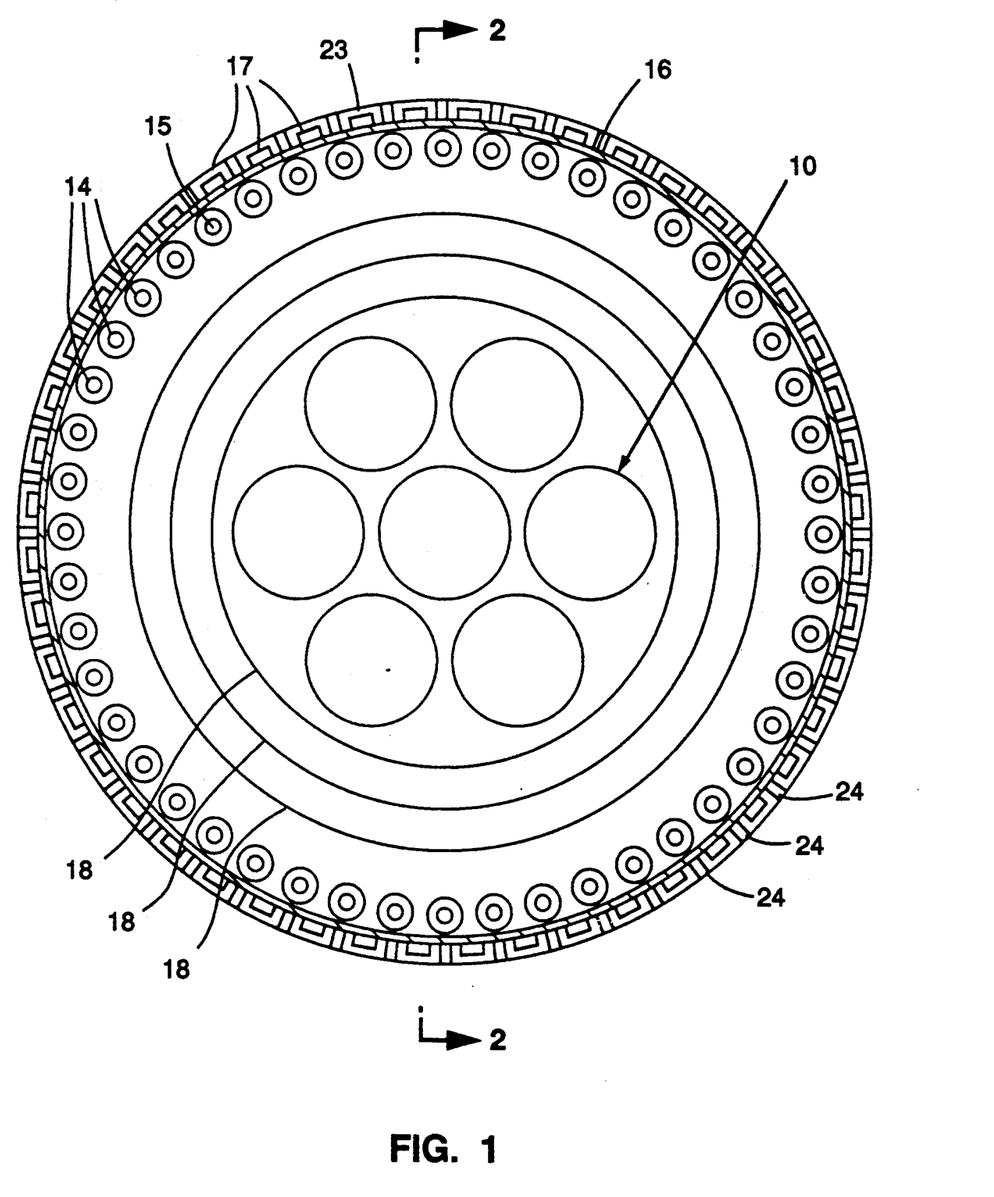
FIG. 1 shows an end view of the apparatus of the present invention.
Figure 2:
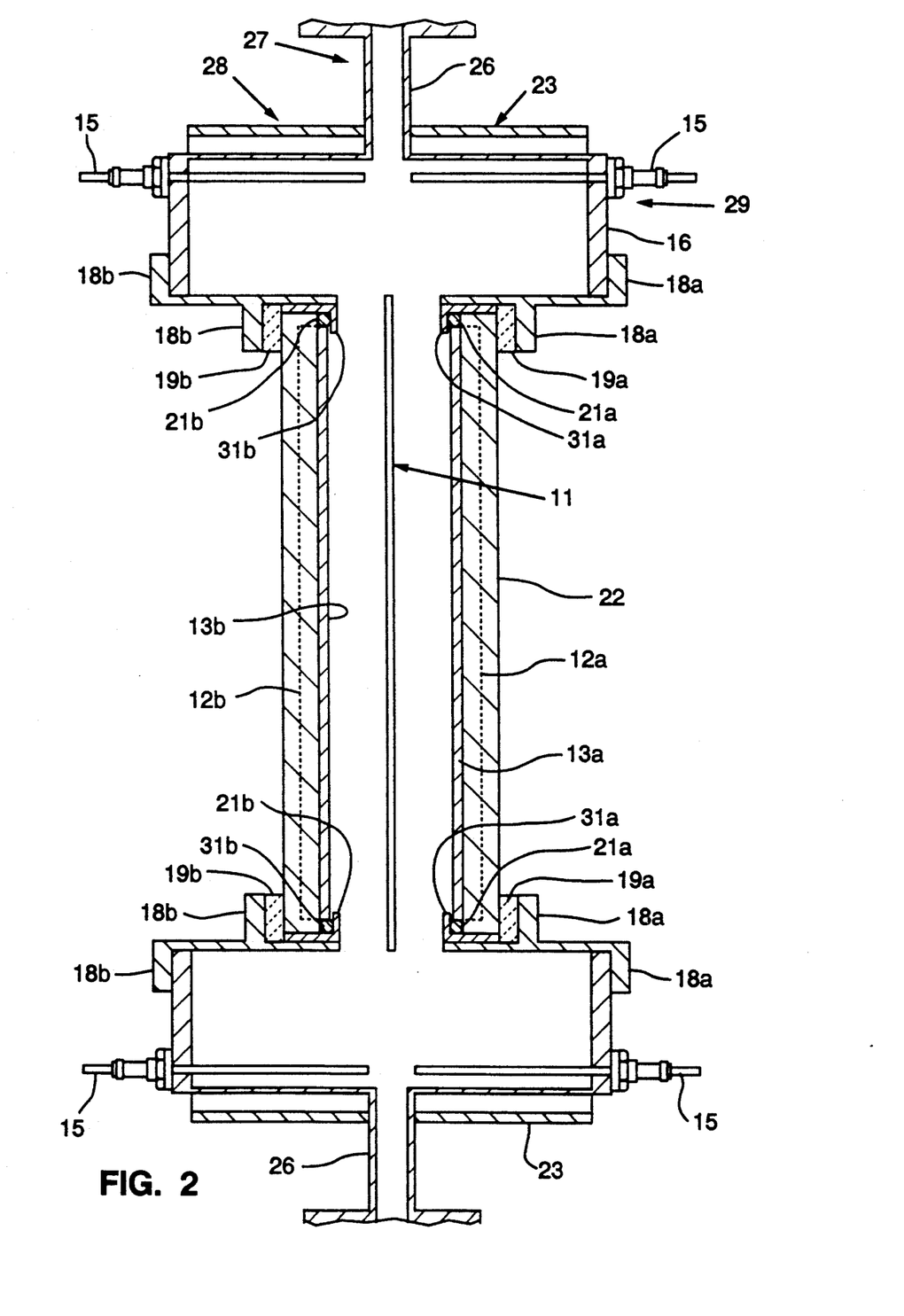
FIG. 2 is a cut-away view taken along Line A of FIG. 1.

Attention is drawn to FIGS. 1 and 2. FIG. 1 shows the substrate 10 to be plated by the sputtering apparatus of the present invention. Substrates 10 are positioned on a substrate platen 11, a side view of which is shown in FIG. 2. FIG. 2 is a cross-section of the spoolpiece chamber 16 taken at Line A of FIG. 1. FIG. 2 shows a circularly symmetric sputtering source comprised of two high-radio frequency-powered planar disk diode electrodes 12(a) and 12(b), each of which is attached a sputtering target 13(a) and 13(b), respectively. They are positioned within an ultrahigh-radio frequency-powered (or microwave-powered) surrounding ring antennae array 14. The individual antennae 15 are on a bolt circle diameter mounted near the inside (vacuum side) cylindrical surface of the vacuum spoolpiece chamber section housing 16. The antennae array 14 is juxtaposed to a multipolar permanent-magnet array 17 on the outside (atmospheric-air side) of this chamber section 16. Note: The drawings in general do not show the fastener bolts and bolt holes, or the 0-rings and 0-ring grooves for the vacuum-to-air seals, or the water-cooling channels in the rf electrodes. P. D. Davidse and L. I. Maissel, in U.S. Pat. No. 3,369,991, herein incorporated by reference, entitled "Apparatus for Cathode Sputtering Including a Shielded RF Electrode," issued Feb. 20, 1968 (filed Jan. 28, 1965), assigned to IBM Corp., disclose the high-radio frequency-powered planar disk diode sputtering source.

The planar disk diode 11 is operated at a suitable ISM 10 radio frequency of 13.56 MHz, and the ring antennae array 14 at suitable ISM radio frequencies of 915 MHz or 2.45 GHz. A convenient size for this source that would result in very attractive product throughputs is one having a sputtering-target 13 diameter of 20 inches (508 mm) and having the antennae array 14 on a bolt circle diameter of 30 inches (762 mm).

The planar disk diode 12(a) and target 13(b) are positioned by electrode flange mounting ring 18(a) and annular insulator ring 19(a). Likewise the planar disk diode 12(b) and target 13(b) are positioned by electrode flange mounting 18(b) and annular insulator ring 19(b). Target clamping ring 21(a) holds the target 13(a) next to the diode 12(a), as does target clamping ring 21(b) hold target 13(b) next to diode (12b). Each electrode flange mounting 18(a) and 18(b) is connected to respective ends of the spoolpiece chamber section housing 16. FIG. 1 shows the corner edges of an electrode flange mounting 18 depicted in a circular fashion around the substrates 10. This center section of the present invention has an atmospheric-air side 22.

In the following description, features of the preferred embodiment will be both referred to by their (a) and (b) pairs as well as by the common numeral as clarity requires.

The antennae array 14 is operated in the electron-cyclotron-resonance mode in which the resonance magnetic field necessary for plasma excitation [87.5 mT (875 Gauss) at 2.45 GHz or 32.68 mT (326.8 Gauss) at 915 MHz] is provided by a multipolar magnetic field. In the preferred embodiment, this multipolar magnetic field is generated by a ring of forty-eight equispaced parallel rows of permanent magnets 17 mounted on the outside (atmospheric-air side) cylindrical surface 28 of a spoolpiece chamber section 16, arranged such that successive north and south poles face inward. The spoolpiece chamber section 16 has an outside diameter of 31.5 inches (800 mm), an outside length of 6.63 inches (168.4 mm), and a cylindrical wall thickness of 0.10 inch (2.5 mm), and is fabricated of UNS S31600 austenitic stainless steel, which is nonmagnetic.

Figure 3:
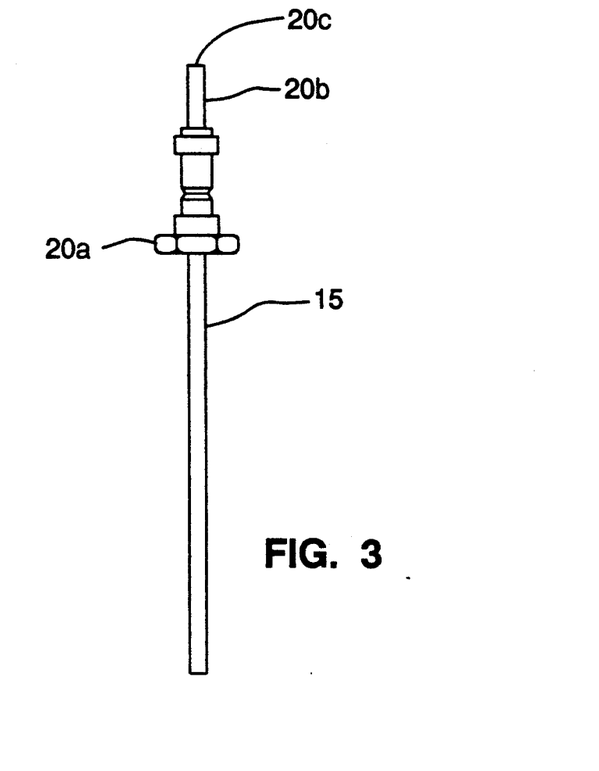
FIG. 3 shows an antennae of the preferred embodiment.

The electrical energy is supplied to the plasma by the ring of equispaced forty-eight parallel rows of water-cooled tubular antennae 15 such as that shown in FIG. 3, which are readily available. Antennae 15 has a mounting flange 20(a), a coaxial water connection 20(b) and an electrical connection 20(c). Alternatively, a ring of any number of equispaced parallel rows of antennae, such as twenty-four or twelve, located in juxtaposition to each or every other, respectively, inward north-pole-facing (or south-pole-facing) permanent-magnet row could be used. In this approach for each thin-film layer, dual-side coating of a platen 11 of several disk substrates 10 in the static-deposition mode from a pair of these large-area sputtering sources is also employed.

Figure 4:
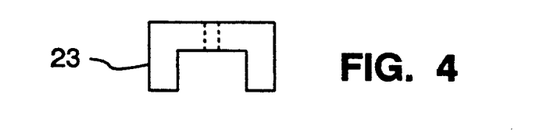
FIG. 4 shows a top view of a horseshoe magnet of the preferred embodiment.
Figure 5:
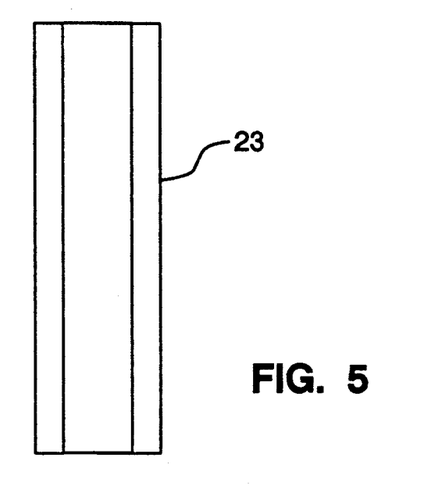
FIG. 5 is a front view of the magnet of FIG. 4.

FIGS. 4 and 5 show an efficient shape for the permanent magnets 23 of magnet array 17 that maximizes the useful flux to the inside annulus and that ensures a high resistance to demagnetization is the channel horseshoe. A convenient size for the channel horseshoe magnet 23 made of Alnico 5 alloy is a length of 6.000 inches (152.4 mm), width of 1.750 inches (44.45 mm), height of 1.000 inch (25.4 mm), thickness of 0.375 inch (9.525 mm), and gap of 1.000 inch (25.4 mm)—which is commercially available. The channel horseshoe magnets are arranged such that the like of adjacent magnets are adjacent, with the intervening space filled by a holding rack 24 made of high-permeability low-carbon steel.

As a result of geometry of the forces imposed by the antenna and magnet configuration, the plasma is thereby confined in a magnetic bottle. The charged species (electrons and with them the ions) are reflected back into the plasma by the magnetic mirror instead of being lost by recombination on the cylindrical wall. With appropriate selection of the permanent magnets, the magnetic field strength is somewhat above 100 mT (1000 Gauss) at the center of each pole field and decreases to a few Gauss at 100 mm (4 inches) from each magnet. Hence, the central plasma is free of magnetic fields.

The resulting plasma sustained by the distributed antennae array is homogeneous, isotropic, and uniform in electron/ion density within this central magnetic-field-free region. A plasma density as high as $3 \times 10^{11}$ electrons and ions/cm$^3$ can be obtained at a typical pressure of 0.1 Pa (0.75 mtorr) corresponding to $2.5 \times 10^{13}$ atoms and/or molecules/cm$^3$, so that the degree of ionization is about $10^{-2}$ (i.e., 1.0 percent). The pressure can be as high as 1.0 Pa (7.5 mtorr) and as low as $10^{-3}$ Pa ($7.5 \times 10^{-6}$ torr) with the plasma remaining homogeneous. Over this pressure range with the long mean free paths, the gas discharge is a diffusion plasma thus accounting for its uniformity.

The electron temperature is low, being slightly above 2 eV in an argon gas discharge. Argon is introduced at gas inlet 26. Of course, the system operates in a vacuum, effectuated by vacuum pump (now shown), or desirably, a combination of pumps, such as a turbomolecular or compound turbomolecular and molecular-drag pump backed by a two-stage oil-sealed rotary vane pump together with the addition of a Polycold ® Freon ®-refrigerator cryocoil for high-speed pumping of water vapor. Because of the effectiveness of the electron trapping in the lobes developed by the alternating magnetic polarity, the floating potential is somewhat above ground potential and the plasma potential is some 10 V above the floating potential. Since the sputtering threshold for most materials is above 20 V, this very-high-plasma-density gas discharge is generated without the necessity of having to sputter any surface. This decoupling of the plasma excitation from plasma-surface interaction (sputtering) is ideal because it allows independent control of voltage and current density at both the diode electrode 13 and substrate 10 electrodes, powered by power inputs (not shown), respectively.

Since the high-radio frequency-powered planar disk diode electrode 12 is located within the central magnetic-field-free region of the circular surrounding distribute electron-cyclotron-resonance-operated antennae array, there are several advantages to this configuration, among which are the following:

A) A planar disk diode electrode 12 with minimal stray capacitance to ground, thereby minimizing the reactance currents that flow and providing efficient rf-power coupling to the target 13, is easily accomplished in that the electrode assembly is mounted from the outside on a flanged opening on the circular flat surface 28 of the spoolpiece chamber section 16 and with the power and water connections made on the atmospheric-air side 29. This arrangement also allows the rf-impedance-matching-network box [required for transforming the discharge impedance to the 50 ohm impedance of the rf generator (the rf power supply)] to be located adjacent to the rf-electrode assembly, thereby minimizing the connecting-copper-strap length and its inductance and hence minimizing the inductive voltage drop and the resulting power loss.

The minimal-capacitance rf-planar-disk-diode electrode 12 consists of a stainless steel housing 22 having a brazed (or electron-beam-welded) copper insert with a diameter the same as that of the target 13—the stainless steel for mechanical strength and bolt-thread integrity (not shown) for the target clamping ring 21 and the flange mounting 18, and the copper for thermal and electrical conductivity. Countercurrent water-cooling channels (not shown) are incorporated in the electrode 12. The electrode electrical insulator 21 is an annular ring whose outside diameter equals that of the electrode 12 plus the ground-shield spacing 31, and is located on the electrode 12 backside (atmospheric air side) out of the way of the film deposition by the sputtered atoms. The sputtered atoms are further obstructed by the annular-ring ground shield 19 mounted over the target clamping ring 21.

The sputtering targets 13 are clamped securely to the electrode 12 with the use of a conductive elastomer membrane (not shown) between the target 13 and electrode 12 surfaces. The targets 13 are easily replaced and costly target bonding is avoided.

B) The most efficient sputtering target voltage range is that over which the sputtering yields increase linearly with increasing voltage, i.e., in the 300 to 800 V range. Because of the above-described decoupling, the target voltaee is selected by the 13.56 MHz-power-input amount and the current density independently by the 915 MHz- or 2.45 GHz-power-input amount. Since the circular symmetry of the antennae array 14 and the circular planar disk symmetry of the electrode 12 both result in a uniform plasma density across the target 13 diameter, sputtering occurs at high rates and uniformly over the entire target area.

C) Sputtering-target-material utilization is a maximum because the target 12 is eroded uniformly over its area.

D) Sputtering-target-material collection efficiency is a maximum because, with a target diameter of 20 inches (508 mm) and a target-to-substrate spacing of 2.0 inches (50.8 mm), 81.90% of the target material lands on a substrate 10 surface of 20 inches(508 mm) diameter parallel to and coaxial with the target 13. The film-thickness and film-morphology uniformity area is the substrate surface 10 of 18 inches (457 mm) diameter parallel to and coaxial with the target 13.

It should be noted that with a target 13 diameter of 6.0 inches (152.4 mm) and a target-to-substrate spacing of 2.0 inches (50.8 mm), this collection efficiency is reduced to 51.95%; at 4.0 inches (101.6 mm) and same spacing, to 38.20%.

E) Sputtering targets 13 comprised of or containing magnetic (ferromagnetic or ferrimagnetic) materials are uniformly and efficiently sputter-eroded, unlike in magnetron diode sputtering sources where magnetic target materials act as a magnetic shunt for the magnetic field.

F) During the sputter-deposition step the substrate platen 11 holding any number of disk substrates 10 fitting within a diameter of 17.5 inches (444.5 mm) parallel to and coaxial with the sputtering sources (electrode 12 and target 13) can easily be high-radio frequency (13.56 MHz) biased for control of the film morphology.

G) Simultaneous dual-side coating as described herein with respect to the preferred embodiment is easily accomplished with the combination of two sputtering sources (a source comprising electrode 12 and target 13) opposite one another and coaxially arranged as shown in FIG. 2.

H) The configuration of oppositely facing circularly symmetric sputtering sources contained within a rectangular box chamber allows an inline modular sequence of these chambers with rectangular isolation values between them. The substrate platens 11 are transported from chamber to chamber by a carriage transfer mechanism based upon the rack-and-pinion-drive principle and located in each chamber well below the processing (substrate heating, substrate sputter-etch cleaning, sputter deposition) area. The substrate platen 11 is electrically and thermally isolated from its carriage transfer mechanism by ceramic standoffs. This drive mechanism is a very reliable one for use within vacuum chambers, in which a rotary-motion feedthrough transmits the shaft rotation of the stepper or servo motor mounted outside the chamber to positive rotation of a pinion gear inside which in turn drives a rack attached to the carriage, thereby converting rotary motion to linear motion.

A particularly fine version of the carriage transfer mechanism is described in U.S. Patent, "Substrate Transfer Apparatus For A Vacuum Coating System," issued to R. L. Shroder, U.S. Pat. No. 4,024,128, issued Aug. 16, 1977 (filed Nov. 26, 1975), assigned to Airco, Inc.

For the case of a magnetic-recording application, the materials for the thin-film layers applied to the metal substrates by a sputtering apparatus of the present invention include the following:

(1) a hard, refractory, chemically inert first coating selected from the group consisting of nitrides, carbides, or borides of titanium, zirconium, hafnium, vanadium, niobium, tantalum, chromium, molybdenum, or tungsten, or the group consisting of aluminum nitride, silicon nitride, or silicon carbide on the metal substrate;

(2) a second coating consisting of chromium, a suitable chromium-vanadium alloy, or any other appropriate chromium alloy;

(3) a third coating consisting of an appropriate cobalt-chromium alloy, cobalt-chromium-tantalum alloy, or any other suitable cobalt alloy;

(4) a fourth coating consisting of titanium as an interfacial adhesion layer; and (5) a fifth coating consisting of amorphous carbon with high diamond-like content, but with some graphite-like content.

Figure 6:
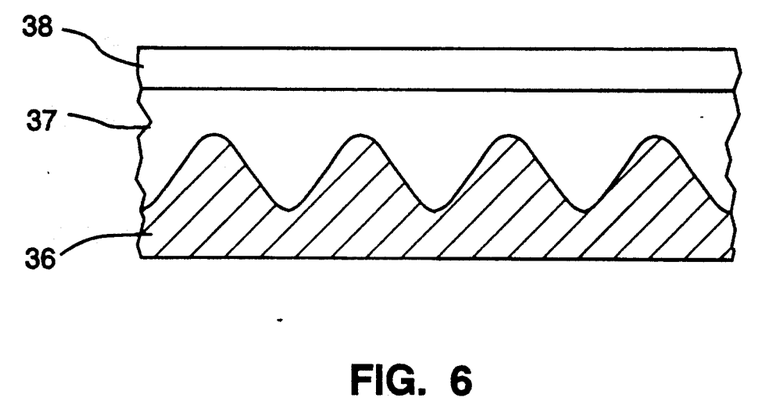
FIG. 6 shows a substrate coated with a first composition of the present invention deposited on the substrate by an apparatus of the present invention.

FIG. 6 shows a metal substrate 36 having a first coating 7 selected from the group consisting of nitrides, carbides, or borides of titanium, zirconium, hafnium, vanadium, niobium, tantalum, chromium, molybdenum, or tungsten in accordance with the present invention. Layer 8 represents a coating suitable in magnetic-recording media compounds, for example, those listed above as (2)-(5).

As disclosed in U.S. patent application Ser. No. 07/771,348, and herein incorporated by reference, entitled "Coating of Aluminum-Alloy or Other Metal Disk Substrates/Vacuum-Deposition Steps; Evaporative Reactive Ion Plating and Reactive Sputtering," wherein the inventors are the same as those in the present application, a hard, refractory, chemically inert coating which avoids nodules, pits and bumps without labor-intensive methods is provided by coating a metal-disk substrate with titanium nitride or compounds from related similar systems. This coating is applied to a flat cold-rolled or surface-ground metal disk by evaporative reactive ion plating or by reactive sputtering.

Figure 7:
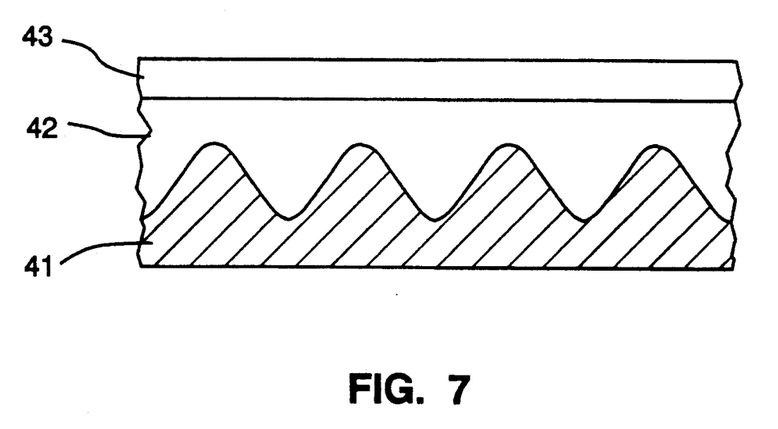
FIG. 7 shows a substrate coated with a second composition of the present invention deposited on the substrate by an apparatus of the present invention.

FIG. 7 shows a metal substrate 41 having a first coating selected from the group consisting of aluminum nitride, silicon nitride, or silicon carbide. Layer 43 represents a coating of suitable magneto-optical recording media compounds.

As disclosed in U.S. patent application Ser. No. 07/797,409, and herein incorporated by reference, entitled, "An Electrically Insulating Coating on Metal Disk Substrates For Magneto-Optical Disk Applications," wherein the inventors are the same as those in the present application, a coating such as aluminum nitride is applied to a flat cold-rolled or surface-ground metal disk substrate by evaporative reactive ion plating or by reactive sputtering in order to distance the effect of the metal substrate from the magneto-optical layer. Magneto-optical media compounds of the present invention are disclosed therein.

Clearly, the general object of the present invention to provide an improved and very versatile sputtering system configuration for the manufacture of magnetic-recording and magneto-optical data-storage disks has been met. Moreover, object of the present invention to reduce the costs involved in the manufacture of magnetic-recording and magneto-optical disks has also been met. Furthermore, the object of the present invention to provide a means of achieving a high deposition rate has been met as has the object of the present invention to provide maximum (greater than 90%) utilization of the sputtering-target material. Finally, the object of the present invention to provide high-radio frequency substrate bias sputtering, with higher bombarding ion current density than is normal, for enhanced control of the film morphology and hence control of the magnetic properties has also been met.

While the present invention has been shown and described in what is presently conceived to be the most practical and preferred embodiment of the invention, it will become apparent to those of ordinary skill in the art that many modifications thereof may be made within the scope of the invention, which scope is to be accorded the broadest interpretation of the claims so as to encompass all equivalent structures.

What is claimed is:

1. A sputtering apparatus for deposition of a thin film on a substrate, comprising:
   means for exciting a plasma at the electron cyclotron resonance to create a region of plasma which is devoid of magnetic field, wherein said means includes
   a plurality of magnets arranged for confining the plasma in said region, said arrangement having an axis; and
   a plurality of antennae arranged coaxially with said plurality of magnets;
   at least one planar disk diode positioned coaxially with said plurality of antennae and positioned at one end of said region devoid of magnetic field;
   a target attached to said planar disk diode; and
   means for positioning a substrate parallel to said planar disk diode.

2. An apparatus as recited in claim 1 wherein said sputtering apparatus is housed within a spool piece chamber section having an exterior and an interior, and said magnets are positioned on said exterior of said chamber section.

3. An apparatus as recited in claim 1 wherein said magnets are channel horseshoe magnets.

4. An apparatus as recited in claim 1 further comprising;
   a second planar disk diode positioned at an opposite end of said region; and
   a second target attached to aid second planar disk diode.

5. A method for deposition of a thin film on a substrate in an apparatus having a plurality of magnets arranged for confining a plasma in a region, said arrangement having an axis and a plurality of antennae arranged coaxially with said plurality of magnets, said method comprising the steps of:
   exciting a plasma at the electron cyclotron resonance to create a region of the plasma which is devoid of magnetic field;
   providing rf power to at least one rf planar disk diode positioned coaxially with said plurality of antennae and positioned at one end of said region devoid of magnetic field;
   generating sputtered atoms form a target attached to said rf planar disk diode; and
   locating a substrate to be bias sputtered parallel to said rf planar disk diode.

6. A method as recited in claim 5 further comprising the steps of:
   providing power to a second rf planar disk diode position an opposite end of said region; and
   generating sputtered atoms from a second target attached to said second rf planar disk diode.

7. A method as recited in claim 5 further comprising the step of:
   applying a first coating selected from the group consisting of nitrides, carbides, or borides of titanium zirconium, hafnium vanadium, niobium, tantalum, chromium, molybdenum, or tungsten on said substrate.

8. A method as recited in claim 7 wherein said thin film on said substrate is further coated with magnetic-recording media.

9. A method as recited in claim 5 further comprising the step of:
applying a first coating selected from the group consisting of aluminum nitride, silicon nitride, or silicon carbide on said substrate.

10. A method as recited in claim 9 wherein said thin film on said substrate is further coated with magneto-optical media.

11. A sputtering apparatus for depositing thin films on substrates, said apparatus comprising:
a chamber having therein a central sputtering region and an annular plasma generation region surrounding the sputtering region, wherein the sputtering and plasma generation regions are centered about a chamber axis, and wherein the plasma generation region extends along the chamber axis to a greater extent than does the sputtering region;
a planar disk diode positioned in the sputtering region of the chamber on the chamber axis and having a sputtering target facing the sputtering region, wherein the planar disk diode defines a lateral boundary of the chamber in the sputtering region;
positioning means for positioning a substrate within the sputtering region adjacent to the planar disk diode; and
plasma generation means for forming a ring of plasma in the annular plasma generation region of the chamber for diffusion into the sputtering region of the chamber, said plasma generation means including a plurality of antennae and associated magnets surrounding the sputtering region and coaxial to the chamber axis, wherein the antennae are positioned inside the chamber, and wherein the antennae and magnets excite the plasma at the electron cyclotron resonance and confine the plasma to an area surrounding an including the sputtering region.

12. A sputtering apparatus as recited in claim 11 wherein the antennae are positioned inside the chamber parallel to the chamber axis.

13. A sputtering apparatus as recited in claim 11 wherein the magnets are channel horseshoe magnets with elongated poles that are positioned outside the chamber with their elongated poles aligned with the chamber axis, wherein the magnets are arranged so that adjacent poles of adjacent magnets are the same polarity, and wherein each antenna is positioned proximate the adjacent poles of like polarity of two adjacent magnets.

14. A sputtering apparatus as recited in claim 13 further comprising a holding rack of ferromagnetic material disposed between adjacent magnets.

15. A sputtering apparatus as recited in claim 11 wherein the antennae and associated magnets are arranged in two groups disposed on opposite sides of the plane of the substrate with a gap between the two groups in the plane of the substrate to allow the substrates to be moved into and out of the chamber.

16. A sputtering apparatus as recited in claim 11 further comprising a second planar disk diode positioned in the sputtering region of the chamber on the chamber axis and forming a lateral boundary of the chamber in the sputtering region, wherein the second planar disk diode has sputtering target facing the sputtering region on the opposite side of the substrate from the other sputtering target.

17. A sputtering apparatus as recited in claim 11 wherein the planar disk diode is mounted to the chamber by a mounting ring having means for attaching the mounting ring to the outside of the chamber.

18. A sputtering apparatus as recited in claim 11 wherein the antennae, the magnets, and the planar disk diode are circularly symmetric with respect to the chamber axis.

19. A sputtering apparatus as recited in claim 11 further comprising transfer means for moving the positioning means into and out of the sputtering region of the chamber and for stopping the positioning means within the chamber during a sputtering operation.

20. A sputtering apparatus for depositing both electrically conductive and insulating thin films on substrates, said apparatus comprising:
a chamber having therein a central sputtering region and an annular plasma generation region surrounding the sputtering region, wherein the sputtering region is cylindrical in shape with a planar disk diode forming one lateral side thereof and a circumferential periphery thereof being open to and surrounded by the plasma generation region, and wherein the cylindrical sputtering region and annular plasma generation region are coaxial to a chamber axis;
a planar disk diode positioned in the sputtering region of the chamber and coaxial to the chamber axis, wherein the planar disk diode has a sputtering target facing the sputtering region in a plane normal to the chamber axis;
positioning means for positioning a substrate within the sputtering region adjacent to the planar disk diode in a plane normal to the chamber axis; and
plasma generation means for forming a ring of plasma in the annular plasma generation region of the chamber for diffusion into the central sputtering region of the chamber, said plasma generation means including a ring antenna array and associated multipolar magnetic array coaxial to the chamber axis and surrounding the sputtering region for exciting the plasma at the electron cyclotron resonance and confining the plasma to an area surrounding and including the sputtering region, and wherein the ring antenna array includes antennae positioned inside the chamber parallel to the chamber axis.

21. A sputtering apparatus as recited in claim 20 wherein the multipolar magnetic array includes channel horseshoe magnets with elongated poles that are positioned outside the chamber with their elongated poles aligned with the chamber axis, wherein the magnets are arranged so that adjacent poles of adjacent magnets are the same polarity, and wherein each antenna of the ring antenna array is positioned proximate the adjacent poles of like polarity of two adjacent magnets.

22. A sputtering apparatus as recited in claim 21 further comprising a holding rack of ferromagnetic material disposed between adjacent magnets.

23. A sputtering apparatus as recited in claim 20 wherein antennae of the ring antenna array and associated magnets of the multipolar magnetic array are arranged in two groups disposed on opposite sides of the plane of the substrate with a gap between the two groups in the plane of the substrate to allow the substrates to be moved into and out of the chamber.

24. A sputtering apparatus as recited in claim 20 further comprising a second planar disk diode positioned in the sputtering region of the chamber on the chamber axis and forming a lateral side of the sputtering region, wherein the second planar disk diode has a sputtering target facing the sputtering region in a plane normal to the chamber axis and on the opposite side of the substrate from the other sputtering target.

25. A sputtering apparatus as recited in claim 20 wherein the planar disk diode is mounted to the chamber by a mounting ring having means for attaching the mounting ring to the outside of the chamber.

26. A sputtering apparatus as recited in claim 20 further comprising transfer means for moving the positioning means into and out of sputtering region of the chamber and for stopping the positioning means within the chamber during a sputtering operation.

27. A sputtering apparatus for depositing both electrically conductive and insulating thin films on substrates, said apparatus comprising:

a chamber having therein a central sputtering region and an annular plasma generation region surrounding the sputtering region, wherein the sputtering region is cylindrical in shape with two planar disk diodes forming opposite lateral sides thereof and a circumferential periphery thereof being open to and surrounded by the plasma generation region, and wherein the cylindrical sputtering region and annular plasma generation region are coaxial to a chamber axis;

two planar disk diodes positioned in facing relation in the sputtering region of the chamber and coaxial to the chamber axis, each planar disk diode having a sputtering target facing the sputtering region in a plane normal to the chamber axis;

positioning means for positioning a substrate within the sputtering region between the two planar disk diodes in a plane normal to the chamber axis; and plasma generation means for forming a ring of plasma in the annular plasma generation region of the chamber for diffusion into the central sputtering region of the chamber, said plasma generation means including a plurality of antennae and associated magnets surrounding the sputtering region and coaxial to the chamber axis for exciting the plasma at the electron cyclotron resonance and confining the plasma to an area surrounding and including the sputtering region, wherein the antennae are positioned inside the chamber parallel to the chamber axis.

* * * * *